United States Patent [19]

Shigeta et al.

[11] Patent Number: 4,865,659
[45] Date of Patent: Sep. 12, 1989

[54] HETEROEPITAXIAL GROWTH OF SIC ON SI

[75] Inventors: Mitsuhiro Shigeta, Joyo; Akira Suzuki, Nara; Katsuki Furukawa, Sakai; Yoshihisa Fujii, Nara; Akitsugu Hatano, Tenri; Atsuko Uemoto, Nara; Kenji Nakanishi, Shijonawate, all of Japan

[73] Assignee: Sharp Kabushiki Kaisha, Osaka, Japan

[21] Appl. No.: 124,732

[22] Filed: Nov. 24, 1987

[30] Foreign Application Priority Data

Nov. 27, 1986 [JP] Japan .................. 61-284980
Nov. 27, 1986 [JP] Japan .................. 61-284982
Feb. 2, 1987 [JP] Japan .................. 62-23080

[51] Int. Cl.$^4$ .................. H01L 21/20; H01L 21/205
[52] U.S. Cl. .................. 148/33; 148/DIG. 29; 148/DIG. 72; 148/DIG. 97; 148/DIG. 148; 156/613; 437/81; 437/100; 437/126; 437/939; 437/770; 437/976
[58] Field of Search .................. 148/DIG. 29, 72, 97, 148/110, 127, 148, 25, 33.4, 33; 156/610-614; 437/81, 100, 103, 106, 126, 132, 131, 939, 970, 976

[56] References Cited

U.S. PATENT DOCUMENTS

| 3,386,866 | 6/1968 | Ebert et al. | 437/100 |
| 3,520,740 | 7/1970 | Addamiano | 437/100 |
| 3,788,890 | 1/1974 | Mader et al. | 437/81 |
| 3,920,492 | 11/1975 | Sugita et al. | 437/976 |
| 3,960,619 | 6/1976 | Seiter | 437/100 |
| 4,451,391 | 5/1984 | Marinace | 437/100 |
| 4,512,825 | 4/1985 | Addamiano et al. | 437/100 |
| 4,623,425 | 11/1976 | Suzuki et al. | 156/613 |

FOREIGN PATENT DOCUMENTS 2030699  2/1987  Japan ................... 437/100

OTHER PUBLICATIONS

Shibahara et al., "Surface Morphology of Cubic SiC (100) Grown on Si (100) by Chemical Vapor Deposition", J. Crystal Growth, 78 (1986), 538-544.
Liaw et al., "Epitaxial Growth and Characterization of $\beta$-SiC Thin Films", J. Electrochem. Soc., Mar. 1985, pp. 642-648, vol. 132, No. 3.
Kuriowa et al., "Vapor-Phase Deposition of Beta-Silicon Carbide or Silicon Substrates", J. Electrochem. Soc., vol. 120, No. 1, Jan. 1973, pp. 138-140.
Bean et al., "Some Properties of Vapor Deposited SiC", J. Electrochem. Soc., vol. 114, No. 11, Nov. 1967, pp. 1158-1161.
Choudhury et al., "$\beta$-Silicon Carbide Films", J. Electrochem. Soc., vol. 116, No. 10, (1969), pp. 1440-1443.
Shigeta et al., "Inclined Epitaxy of (411) Beta Silicon Carbide on (511) Silicon . . .", (Abstract only), Appl. Phys. Lett., vol. 50, No. 23, 8 Jun. 1987, pp. 1684-1685.
Nishino et al., (1983) Appl. Phys. Lett. 42(5):460-462.

Primary Examiner—Brian E. Hearn
Assistant Examiner—William Bunch
Attorney, Agent, or Firm—Irell & Manella

[57] ABSTRACT

A heteroepitaxial growth method comprising growing a semiconductor single-crystal film on a semiconductor single-crystal substrate with a lattice constant different from that of the semiconductor single-crystal film by chemical vapor deposition, the epitaxial orientation of the semiconductor single-crystal film being inclined at a certain angle with respect to the semiconductor single-crystal substrate.

7 Claims, 1 Drawing Sheet

HETEROEPITAXIAL GROWTH OF SiC ON Si

BACKGROUND OF THE INVENTION

1. Field of the Invention

This invention relates to a crystal growth method by which a good quality single-crystal film is heteroepitaxially grown on a single-crystal substrate. More particularly, it relates to a crystal growth method by which the direction of the plane of the single-crystal film is inclined at a certain angle from the direction of the plane of the single-crystal substrate or the single-crystal film is grown on a selected plane direction of the single-crystal substrate.

2. Description of the Prior Art

Silicon carbide (SiC) is a semiconductor material, which has a wide forbidden energy gap of 2.2 to 3.3 electronvolts (eV) and is thermally, chemically and mechanically stable and also has a great resistance to radiation damage. Both p-type and n-type silicon carbides have good stability, which is rare for widegap semiconductors, making them useful as a semiconductor material for electronic devices operable at high temperatures or with great electric power, for highly reliable semiconductor devices, for radiation-resistant devices, etc., and usable in an environment where difficulties are encountered with devices made of conventional semiconductor materials, thereby greatly enlarging the range of application for semiconductor devices.

Silicon carbide is also useful as a semiconductor material for optoelectronic devices utilizing visible light of short wavelengths and near-ultraviolet light with the use of its wide energy gap. Whereas other wide-gap semiconductor materials such as semiconductors made of II-VI groups, III-V groups, etc., generally contain heavy metals as a main component therein and thus essential problems of pollution and availability of raw materials arise, silicon carbide is free of these problems. Moreover, silicon carbide has many variant structures (i.e., polytype structures).

Despite these many advantages and capabilities, silicon carbide has not yet been placed in actual use because the technique for growing silicon carbide crystals with good reproducibility which is required for commercially producing high quality silicon carbide substrates having a large surface area has yet to be developed.

Conventional processes for preparing single-crystal substrates of silicon carbide on a laboratory scale include the so-called sublimation method (i.e., the Lely method) wherein silicon carbide powder is sublimed in a graphite crucible at 2,200° C. to 2,600° C. and recrystallized to obtain a silicon carbide substrate, the so-called solution method wherein silicon (Si) or a mixture of silicon with impurities such as iron, cobalt, platinum or the like is melted in a graphite crucible to obtain a silicon carbide substrate, and the Acheson method which is generally used for commercially producing abrasives and by which silicon carbide substrates are obtained incidentally.

Although a large number of crystals can be obtained by either the sublimation method or the solution method, it is difficult to prepare large single-crystal substrates of silicon carbide since many crystal nuclei occur at the initial stage of crystal growth. Silicon carbide substrates incidentally obtained by the Acheson method are so inferior in purity and crystallinity that they cannot be used as semiconductor materials. Even though large single-crystal substrates are obtained, they are only incidental and therefore, insignificant to commercial production of silicon carbide substrates. Thus, according to these conventional processes for the production of single-crystal substrates of silicon carbide, it is difficult to control the size, shape and quality of single-crystal substrates of silicon carbide on an industrial scale.

On the other hand, in recent years, with advances in semiconductor technologies, it has been possible to obtain thin single-crystal films of 3C type silicon carbide (which has a cubic crystal structure and an energy gap of 2.2 eV) on silicon substrates, which have been available as large single-crystal substrates, by a heteroepitaxial technique using chemical vapor deposition. Chemical vapor deposition is a crystal growth technique that is excellent in mass-production on an industrial scale and attains the reproducible growth of high quality silicon carbide single-crystal films with a large surface area on silicon substrates. For the epitaxial growth of a thin single-crystal film of 3C type silicon carbide on a silicon substrate, $SiH_4$, $SiCl_4$, $SiH_2Cl_2$, $(CH_3)_3SiCl$, $(CH_3)_2SiCl_2$ or the like are used as a silicon material; $Cl_4$, $CH_4$, $C_3H_8$, $C_2H_6$ or the like are used as a carbon material; hydrogen, argon or the like are used as a carrier gas; and the temperature of the silicon substrate is set to be 1,200° C. to 1,400° C. However, since constituting the silicon substrate is a different material from silicon carbide constituting the single-crystal film, silicon is poor in wettability to silicon carbide. Moreover, the lattice constant of silicon is different from that of silicon carbide by as much as 20%. Accordingly, strain and/or stresses arise in the growth film, which causes warpage and/or cracks and, furthermore, silicon carbide grown on the silicon substrate cannot be single crystal films with a layered structure, but are polytype crystals with a dendrite structure. Even though a thin single-crystal film of silicon carbide is obtained on the silicon substrate, the quality of the crystal deteriorates with an increase in the thickness of the crystal film, resulting in a polytype crystal.

With a GaAlAs single crystal formed on a GaAs substrate and an InGaAs single crystal formed on an InP substrate, which have been put into practical use as a semiconductor material, the difference in lattice constant between the substrate and the growth film is as small as 1% or less, which causes none of the problems mentioned above. However, other combinations of substrates and growth films bring about the abovementioned problems because of different lattice constants therebetween, which causes difficulties in putting them into practical use. FIG. 3 shows the crystal direction of a conventional heteroepitaxial growth, indicating that when a single-crystal growth film B with the lattice constant b is formed on a single-crystal substrate A with the lattice constant a (a<b) by a heteroepitaxial growth technique, the crystal direction of the substrate A is the same as that of the epitaxial growth film B and thus there is a difference in lattice constant at the interface C between the substrate A and the film B, resulting in lattice distortion, which causes crystal defects.

An improved chemical vapor deposition method has been proposed by Appl. Phys. Lett., 42(5), Mar. 1, 1983 p460–p462, wherein the surface of a Si single-crystal substrate is heated and carbonized within a hydrocarbon gas atmosphere, resulting in a SiC thin film on the said surface, and then a silicon material gas and a carbon material gas are supplied thereto to form a SiC single-crystal. The plane directions of the said Si substrate used as a crystal growth substrate are (100) and (111) planes. When SiC is grown on the (100) plane of the Si substrate, microscopic defects such as an antiphase boundary, etc., occur at the silicon-silicon carbide interface. When SiC is grown on the (111) plane of the Si substrate, warpage and/or cracks occur in the resulting SiC growth film. The use of an Si substrate with regard to the (100) and (111) planes as an underlying substrate for crystal growth does not provide the excellent semiconductor material that is essential to obtain semiconductor devices with improved device characteristics.

SUMMARY OF THE INVENTION

The heteroepitaxial growth method of this invention, which overcomes the above-discussed and numerous other disadvantages and deficiencies of the prior art, is a method for the growth of a semiconductor single-crystal film on a semiconductor single-crystal substrate with a lattice constant different from that of the semiconductor single-crystal film, wherein the method comprises growing the semiconductor single-crystal film on the semiconductor single-crystal substrate by chemical vapor deposition, the epitaxial orientation of the semiconductor single-crystal film being inclined at a certain angle with respect to the semiconductor single-crystal substrate.

In a preferred embodiment, the inclination of the epitaxial orientation of the semiconductor single-crystal film to the semiconductor single-crystal substrate is in the range of 0.1 to 30 degrees.

In a preferred embodiment, the semiconductor single-crystal substrate is composed of Si and the semiconductor single-crystal film is composed of SiC. The semiconductor single-crystal film is grown on the (n11) plane of the semiconductor single-crystal substrate (wherein n is a natural number other than 1). In a more preferred embodiment, n is 3 to 6.

The heterostructure of this invention is composed of a semiconductor single-crystal substrate and a semiconductor single-crystal layer with a lattice constant different from that of the substrate that is epitaxially formed on the substrate, the epitaxial orientation of the semiconductor single-crystal layer being inclined at a certain angle with respect to the semiconductor single-crystal substrate.

In a preferred embodiment, the semiconductor single-crystal substrate is composed of Si and the semiconductor single-crystal layer is composed of SiC.

In a preferred embodiment, the inclination of the epitaxial orientation of the semiconductor single-crystal layer to the semiconductor single-crystal substrate is in the range of 0.1 to 30 degrees.

Thus, the invention described herein makes possible the objectives of (1) providing a heteroepitaxial growth method by which a single-crystal growth film is heteroepitaxially formed on a single crystal substrate with a lattice constant different from that of the said single-crystal growth film, resulting in a good quality heteroepitaxial single-crystal growth film having few crystal defects, little warpage and few cracks; (2) providing a heteroepitaxial growth method that is a basic technology contributing to an increase in the performance of the semiconductor devices and to the lowering of production cost of the semiconductor devices and achieving an enlargement of the range of application for semiconductor devices; and (3) providing a method for producing a SiC single crystal film with few crystal defects, thereby attaining the commercial production of semiconductor devices using the SiC single-crystal film.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
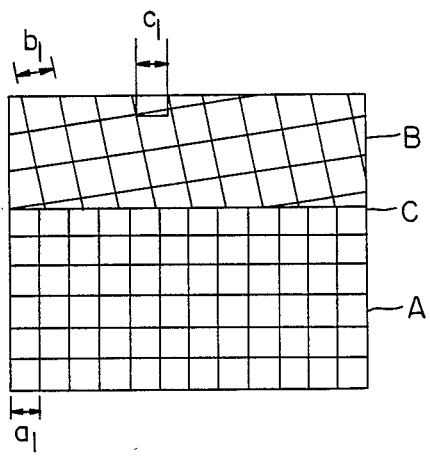
FIG. 1 is a diagram showing the crystal direction of a heteroepitaxial growth method of this invention.

FIG. 1 shows the principle of this invention. When a single-crystal growth film B with the lattice constant b1 is epitaxialy formed on a single-crystal substrate A with the lattice constant a1, the film B is epitaxially grown on the substrate A in such a manner that the epitaxial orientation of the growth film B is inclined at an angle ranging from 1 to 30 degrees with respect to the substrate A. As a result, the difference in lattice constant at the interface C between the substrate A and the growth film B is minimized to thereby reduce the lattice mismatch. This can be explained as follows: Due to the inclination of the plane direction of the crystal growth film B to that of the plane direction of the crystal substrate A, the distance c1 between the crystal lattices of the crystal growth film B at the said interface C, which are parallel to the interface C, becomes smaller than the lattice constant b1 of the crystal growth film B, resulting in a substantial reduction of the lattice mismatch. This is named the inclined epitaxial growth.

EXAMPLE 1

Figure 2:
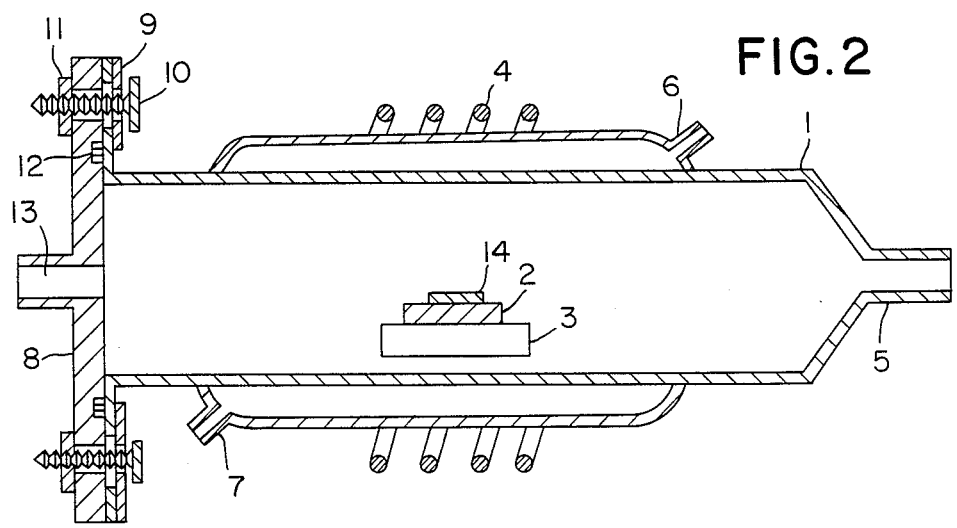
FIG. 2 is a schematic diagram showing an apparatus used for the heteroepitaxial growth method of this invention.
Figure 3:
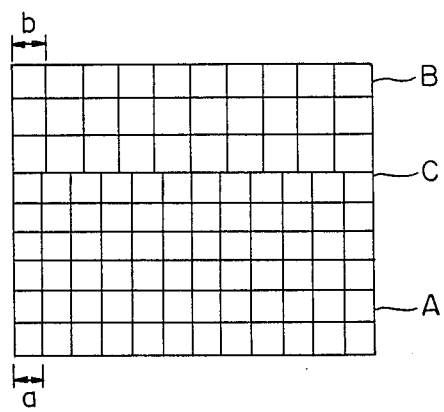
FIG. 3 is a diagram showing the crystal direction of a conventional heteroepitaxial growth method.

FIG. 2 shows an apparatus used for the heteroepitaxial growth method of this invention using the inclined epitaxial growth, where a SiC single-crystal film is heteroepitaxially grown on a Si substrate by chemical vapor deposition. As a source gas, monosilane ($SiH_4$) and propane ($C_3H_8$) are used. The difference in lattice constant between the Si single-crystal substrate and the SiC single-crystal film is about 20%.

The apparatus comprises a water-cooled horizontal quartz double reactor tube 1 which is internally provided with a graphite susceptor 2 either horizontally or inclinationally supported by a support bar 3. The reactor tube 1 is wound with a working coil 4, through which a radio-frequency current is passed to heat the susceptor 2 by induction. The reactor tube 1 has at its one end a branch tube 5 providing a gas inlet. Through branch tubes 6 and 7, cooling water is supplied to the interior of the outer tube of the reactor tube 1. The other end of the reactor tube 1 is sealed by a stainless steel flange 8, a holding plate 9, bolts 10, nuts 11 and an O-ring 12. The flange 8 has a branch tube 13 providing a gas outlet. Using the above-mentioned apparatus, the growth of a SiC crystal is carried out by chemical vapor deposition as follows: A Si single-crystal substrate 14 is placed on the susceptor 2. The (511) plane is used as the crystal direction of the Si substrate plane. Hydrogen is fed to the reactor tube 1 at a rate of 3 liters/min., as a carrier gas, and propane gas is fed to the reactor tube 1 at a rate of about 1.0 cc/min., as a source gas. A radio-frequency current is passed through the working coil 4 to heat the graphite susceptor 2 and raise the temperature of the Si substrate 14 to about 1,350° C. This situation is maintained for about 1 to 5 min., to thereby carbonize the surface of the Si single-crystal substrate 14 and form a thin layer of the SiC single-crystal. Then, monosilane and propane gas, respectively, are fed to the reactor tube at a rate of 0.4 to 0.9 cc/min., for 1 hour together with hydrogen as a carrier gas at a rate of 3 liters/min., and the temperature of the Si substrate 14 is maintained at 1,300 to 1,350° C., resulting in a SiC single-crystal film having a thickness of about 2 μm over the entire surface of the above-mentioned SiC thin layer.

It was observed by x-ray diffraction and electron diffraction that the resulting growth film is a single-crystal film and that the epitaxial orientation of the (511) plane of the growth film is inclined at an angle of 3.7 degrees with respect to the (511) plane of the substrate. As a result, the direction of the epitaxial growth of SiC on the (511) plane of the Si substrate was found to be the SiC (411) plane, but not the SiC (511) plane. No warpage nor cracks occurred in the SiC growth film, and electron-microscopic observations indicated that the SiC growth film was a good quality SiC single-crystal film having few crystal defects.

EXAMPLE 2

When a SiC growth film is epitaxially formed on the (100) plane of a Si substrate, according to a conventional heteroepitaxial growth method, the antiphase boundary tends to arise in the SiC growth film because silicon atoms are horizontally bonded to carbon atoms by the double bonds of carbon atoms that are one atom layer below the said silicon atoms. When the SiC growth film is epitaxially formed on the (n11) plane of the Si substrate, silicon atoms are not horizontally bonded to carbon atoms by the double bonds of carbon atoms because the plane of the growth film inclines at a certain angle from the (100) plane of the substrate, (wherein n is a natural number other than 1).

The (211) plane, the (311) plane, the (411) plane, the (611) plane, etc., other than the (511) plane of the substrate disclosed in Example 1 were applied to this invention in the same way as in Example 1, and the same effects as the (511) plane of Example 1 could be attained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A heteroepitaxial growth method for the growth of a semiconductor single-crystal film on a semiconductor single-crystal substrate with a lattice constant different from that of said semiconductor single-crystal film, wherein said method comprises growing said semiconductor single-crystal film on the (n11) plane of said semiconductor single-crystal substrate by chemical vapor deposition, wherein n is an integer of 3 or greater, the epitaxial orientation of said semiconductor single-crystal film being inclined at a certain angle with respect to said semiconductor single-crystal substrate.

2. A heteroepitaxial growth method according to claim 1, wherein said inclination of the epitaxial orientation of said semiconductor single-crystal film to said semiconductor single-crystal substrate is in the range of 0.1 to 30 degrees.

3. A heteroepitaxial growth method according to claim 1, wherein said semiconductor single-crystal substrate is composed of Si and said semiconductor single-crystal film is composed of SiC.

4. A heteroepitaxial growth method according to claim 1, wherein n is 3 to 6.

5. A heterostructure composed of a semiconductor single-crystal substrate and a semiconductor single-crystal layer with a lattice constant different from that of said substrate that is epitaxially formed on a (n11) face of said substrate, wherein n is an integer greater than 1, the epitaxial orientation of said semiconductor single-crystal layer being inclined at a certain angle with respect to said semiconductor single-crystal substrate.

6. A heterostructure according to claim 5, wherein said semiconductor single-crystal substrate is composed of Si and said semiconductor single-crystal layer is composed of SiC.

7. A heterostructure according to claim 5, wherein the inclination of the epitaxial orientation of said semiconductor single-crystal layer to said semiconductor single-crystal substrate is in the range of 0.1 to 30 degrees.

* * * * *